United States Patent
Gerber

(10) Patent No.: US 7,790,509 B2
(45) Date of Patent: Sep. 7, 2010

(54) METHOD FOR FINE-PITCH, LOW STRESS FLIP-CHIP INTERCONNECT

(75) Inventor: Mark A Gerber, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 12/330,950

(22) Filed: Dec. 9, 2008

(65) Prior Publication Data
US 2009/0325348 A1 Dec. 31, 2009

Related U.S. Application Data

(60) Provisional application No. 61/076,419, filed on Jun. 27, 2008.

(51) Int. Cl.
*H01L 21/44* (2006.01)

(52) U.S. Cl. .............. 438/120; 438/106; 438/108; 438/112; 438/118; 438/124; 257/E21.503

(58) Field of Classification Search .................. 438/120
See application file for complete search history.

(56) References Cited

U.S. PATENT DOCUMENTS

| 6,228,680 B1 | 5/2001 | Thomas |
| 6,537,482 B1 * | 3/2003 | Farnworth .................. 264/482 |
| 6,855,578 B2 | 2/2005 | Odegard et al. |

* cited by examiner

*Primary Examiner*—N Drew Richards
*Assistant Examiner*—Kyoung Lee
(74) *Attorney, Agent, or Firm*—Yingsheng Tung; Wade J. Brady, III; Frederick J. Telecky, Jr.

(57) ABSTRACT

Attaching a semiconductor chip to a substrate by applying mechanical vibrations (150) to a polymeric compound (130) and the contacting areas (114, 124) of a first (113) and a second (121) metallic member immersed in the compound, while the two metallic members approach (140) each other until they touch. The mechanical vibration causes displacements of the first member relative to the second member, and the vibration includes displacements (150) oriented at right angles to the direction (140) of the approach. The polymeric compound (130) includes a non-conductive adhesive resin paste (NCP) and filler particles; the paste is deposited before the attaching step. The first member (113) is affixed to the chip and the second member (121) to the substrate.

15 Claims, 1 Drawing Sheet

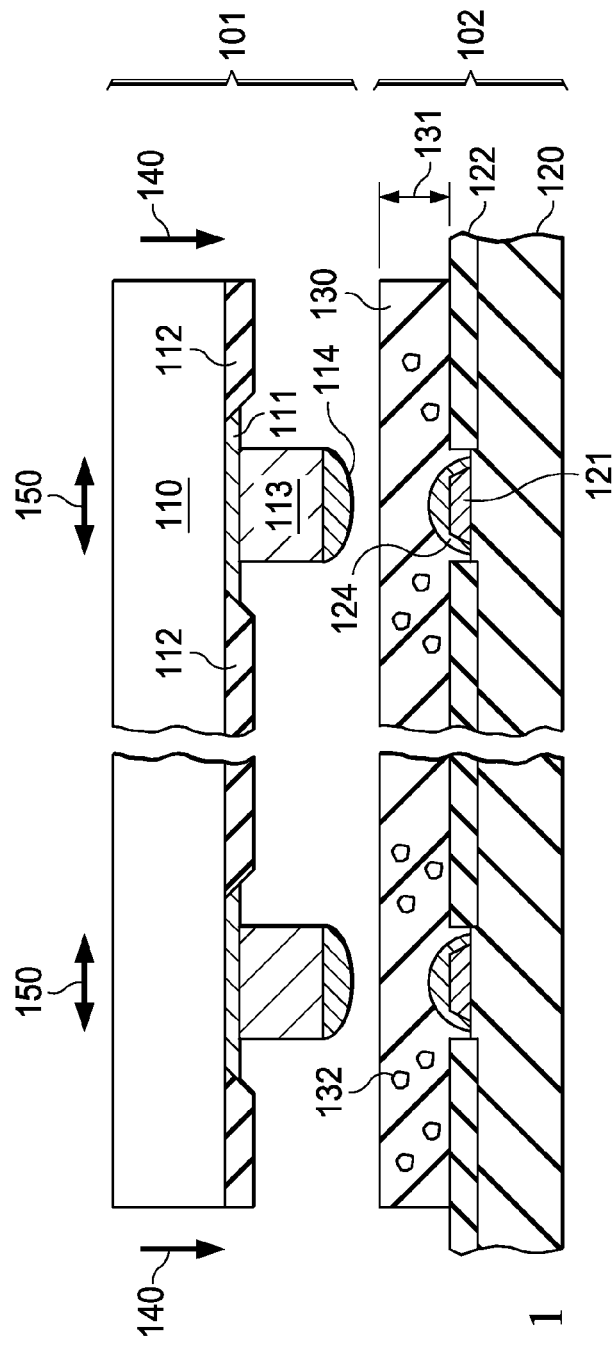
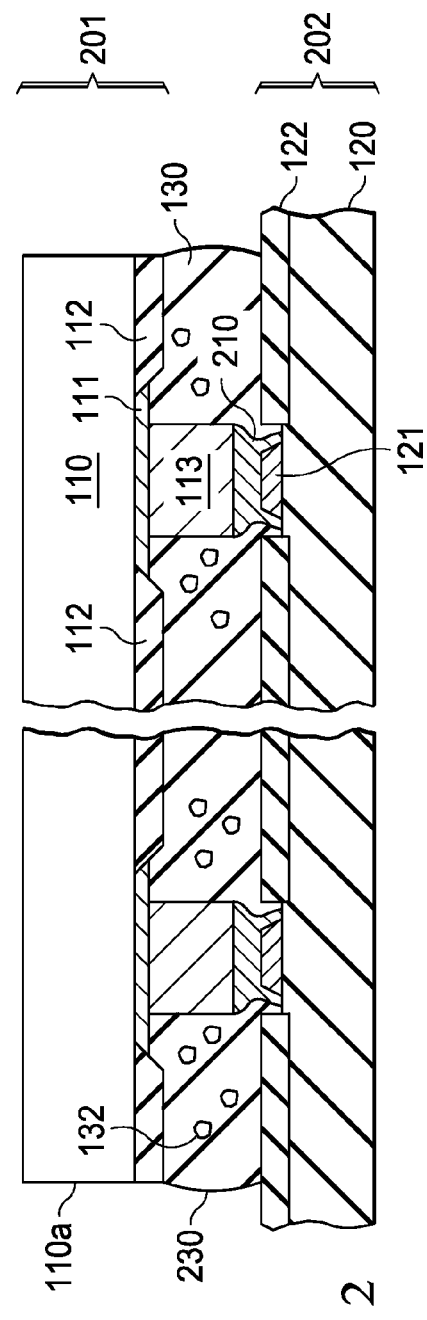
FIG. 1
FIG. 2

METHOD FOR FINE-PITCH, LOW STRESS FLIP-CHIP INTERCONNECT

FIELD OF THE INVENTION

The present invention is related in general to the field of semiconductor devices and processes, and more specifically to the structure and fabrication method of flip-chip assembled fine-pitch bumped chips with stress-mitigating polymeric underfills.

DESCRIPTION OF RELATED ART

In a semiconductor device assembled by the flip-chip technology, the terminals of the semiconductor chip are connected to the contact pads of the substrate by metallic bumps; these bumps are solidly attached to the terminals as well as the pads, and conduct the electrical signals and power. After the assembly process, the chip is spaced apart from the substrate by a stand-off, with the metallic interconnections extending across the stand-off. As an approximate classification, interconnections with bumps of a diameter less than 100 µm and of a pitch center-to-center less than 150 µm are frequently called fine pitch interconnections.

In many semiconductor devices with interconnections larger than fine-pitch, the bumps are solder bodies, such as deformed solder balls. The chip terminals and the substrate pads usually have surfaces with metallurgical affinity to solder wetting, such as a layer of gold or palladium over a nickel layer. Alternatively, other devices use pillars or columns made of copper to provide higher stand-offs, the copper pillars have solder caps for enabling attachment. In fine-pitch devices, the bumps are made of gold, usually shaped as deformed spheres. For connecting to these bumps, the substrates have usually solder-plated copper pads. On the other hand, when the pads are gold plated, the gold-to-gold attachment process needs ultrasonic energy to create metal interdiffusion at the contacts.

The substrate, onto which the semiconductor chips are flipped, are usually made of ceramic or a polymer-based material. Consequently, there is about an order of magnitude difference between the coefficients of thermal expansion (CTE) of the chip and the substrate. As a consequence of this CTE difference, thermomechanical stresses are created on the metallic interconnections and attachment joints, when the assembly is subjected to temperature swings. Especially sensitive to stress are chips, which include mechanically weak low-k dielectric compounds as insulator material underneath the chip terminals.

In order to distribute the mechanical stress, the gap or stand-off after the assembly between the bumped chip and the substrate is customarily filled with a polymeric material. This process step is performed after the flip-chip attachment as a "post-attach" step. The polymeric material typically consists of an epoxy-based precursor, which includes a high percentage of inorganic particles (frequently silica) for reducing the CTE of the precursor. The low viscosity precursor is pulled into gap by capillary forces, leaving a meniscus of about 0.5 mm around the chip perimeter. After the underfilling step, about 1 to 2 hours are needed to allow the polymer to harden ("cure") by forming cross-links.

In fine pitch devices and with decreasing width of the stand-off between chip and substrate, the precursor flow solely by capillary force may not be sufficient to fill the gap uniformly. Especially in large chip devices, random unfilled voids may be left near the stand-off, which cause non-uniformity of stress distribution and may act as centers of local stress. One auxiliary post-attach method to prevent voids and insure uniform filling includes ultrasonic vibration of the assembled chip-on-substrate during the underfilling process. Another post-attach method includes vacuum suction during the underfilling process.

The temperature excursions required for curing the underfill precursor and the subsequent cooling to ambient temperature can create thermomechanical stress on its own. It is known that the sensitivity to any stress-induced damage to the joints and the low-k dielectrics increases strongly with decreasing size and pitch of the interconnection bumps.

Another technique recently introduced for fine pitch devices with gold bumps, a layer of non-conductive polymer paste (NCP) or film is deposited on the substrate surface before the flip-chip attachment. The thickness of the layer or film is selected so that not only the area between the contact pads is covered, but also enough paste or film is placed on, or over, the pads to fill the stand-off between chip and substrate with polymer after completing the flip-chip attach process. The paste used is a thermoset adhesive resin, which has between 60 to 70 volume % particle fillers. The film is also of a thermoset compound. After the paste, or film, deposition, the chip with the metal bumps is flipped onto the solder-capped (or gold plated) pads of the substrate to attach each bump to its respective pad.

SUMMARY OF THE INVENTION

Applicant found that the bump-to-pad contacts made with the pre-attach method frequently show solderability issues during assembly. An analysis of the contact interface revealed numerous inclusions of filler particles, paste residues, and paste voidings around bumps. When the contact areas of two solid members facing each other across a viscous medium start an approach to be brought into intimate contact, applicant discovered that any residue of the medium, especially any solid particle suspended in the medium, can impede the desired contact.

Applicant solved the problem of inclusion of foreign particles in the member joints of two devices by mechanically vibrating one of the members with respect to the other member during the time period of the approach, until the contact areas of the device members touch. The vibrations preferably include displacements at right angles to the direction of the approach. The vibrations expel any foreign particles from the diminishing separation of the contact areas to enable surface contact of the two members without enclosing suspended solid particles or voids.

In one exemplary embodiment, the first member is a metallic bump attached to a semiconductor chip, the other member is a metallic pad of a substrate, and the viscous medium is a non-conductive paste (NCP) applied to the substrate before flip-chip attachment. The thermoset polymer precursor of the NCP includes 60 to 70% inorganic filler of silica particles between about 0.3 and 3 µm diameter. Alternatively, the NCP is pre-applied to the chip. The height of the chip bumps is in the range from 15 to 50 µm and the pitch center-to-center is less than 150 µm. The contact areas of the bumps and the surface of the pads may be covered with a cap of reflowable metal such as solder. During the time period it takes the bumps and pads to approach each other, the chip with the bumps vibrates relative to the substrate with the pads preferably so that the vibration includes displacements at right angles to the direction of the approach. The vibration frequency is preferably between 200 and 500 Hz, but may reach ultrasonic frequencies of more than 20 kHz dependent on the bump contact method. The back-and-forth or circular motion of the bumps expels compound along with any solid particle from the approaching contact areas of bumps and pads until the tip surfaces achieve intimate contact. When the contact areas include a cap of reflowable metal, the touching caps are molten and thus united. Applicant found that the vibrations allow the use of fine pitch solder-capped copper bumps of the chip (copper bump height in the range from 15 to 50 µm and bump pitch center-to-center less than 150 µm) and solder-capped copper pads of the substrate.

This method solves the contact reliability problem and enables the pre-attach method to be fully implemented to achieve underfilling of the stand-off between chip and substrate in fine-pitch devices.

The method can be extended beyond the fabrication of semiconductor devices to an assembly, where the contact areas of any two solid members immersed in a viscous compound are to be joined so that the final contact of the areas is not impeded by a residue of the compound including any solid particle suspended in the compound. Examples of bumped members can be found in Micro-Electro-Mechanical devices (MEMS), medical and photographic devices, and automotive controls.

BRIEF DESCRIPTION OF THE DRAWINGS

FIGS. 1 and 2 illustrate steps of the assembly of a first and a second body according to the invention.

FIG. 1 shows a schematic cross section of a first body with metallic members and a second body with metallic members immersed in a polymeric compound, the first body moving towards the second body while being vibrated by displacements at right angles to the direction of the movement.

FIG. 2 shows a schematic cross section of the assembled device; the members of the first and the second body have been attached, while the stand-off between the first and the second body is filled with the polymeric compound.

DETAILED DESCRIPTION OF THE PREFERRED EMBODIMENTS

In FIG. 1, a first body 101 and a second body 102 are shown. First body 101 includes a base material 110, which by way of example is a semiconductor chip made of silicon, and at least one metallic terminal 111. As examples, terminals 111 are made of an aluminum alloy, copper, or a copper alloy. Terminals 111 are surrounded by a layer of insulating material 112, for instance a solder mask. Affixed to each terminal 111 is a first metallic member 113 made of a non-reflow metal or alloy, which is capped by a layer of reflow metal or alloy. In FIG. 1, first member 113 is shaped as a column or pillar with one end attached to terminals 111 and the opposite end having reflow metal 114. Pillar-shaped members 113 are frequently referred to as bumps or studs. The reflow metal 114 is exemplarily shaped as a half-dome because it has undergone one reflow process; reflow metal 114 represents the contact area of first member 113. (With gold to gold contacts, reflow metal may not be necessary).

The term non-reflow metal is frequently used for metals or alloys with a melting temperature higher than about 500° C.; examples of non-reflow metals are copper, aluminum, gold, and their alloys; the preferred metal is copper. The term non-reflow contrasts with the term reflow metal or alloy; examples of reflow metals include indium and the solders of various kinds, such as tin and tin-based alloys, the preferred solder is tin-silver.

First members 113 may have a large number of adjacent members (not shown in FIG. 1), especially when material 110 is a semiconductor chip. In contemporary semiconductor devices, the pitch center-to-center of adjacent members 113 is less than 150 µm. The combined height of members 113 and caps 114 is preferably in the range from about 15 to 50 µm.

Second body 102 includes a base material 120, which by way of example is an insulator integral with conductive traces and through-holes, and at least one metallic pad 121. In FIG. 1, the pads are surrounded by insulating layer 122. In the example of FIG. 1, pads 121 are second members in locations matching the locations of first members 113. An example is a substrate as used in semiconductor manufacturing such as a board made of FR-4 or a carrier film made of polyimide. Second members 121 are made of a non-reflow metal such as copper or a copper alloy. Second members 121 are capped by a layer of reflow metal or alloy 124 such as tin-based solder. In FIG. 1, the reflow metal 124 is exemplarily shaped as a half-dome because it has undergone one reflow process. Cap 124 represents the contact area of second member 121.

Alternatively, only one of the caps 114 and 124 comprises solder and the other cap comprises a solderable, metal such as gold.

Covering a surface portion of insulator 122 and the solder caps 124 of second members 121 is a layer 130 of adhesive, non-conductive polymeric (NCP) compound. The compound includes a thermoset precursor, for instance an epoxy-based polymer, with a glass transition temperature between about 140 and 180° C. and preferably between about 60 and 70 volume % inorganic filler particles 132. A preferred filler content is 65 weight %, and a preferred filler material 132 is silica; the average filler size is between 0.3 and 3 µm; the filler distribution preferably shows a maximum in the 1 to 2 µm range. The filler particles 132 are needed to lower the coefficient of thermal expansion (CTE) of the compound into the 20 to 25 ppm range. The modulus of the NCP compound is preferably between about 8 and 9 GPa at ambient temperature, and about 2 to 3 GPa at 200° C. The thickness 131 of compound layer 130 is selected so that the height of members 113 will be immersed in compound 130 after completing the assembly step (see FIG. 2). Consequently, thickness 131 is preferably between about 15 and 50 µm.

Layer 130 may be deposited on the surface of insulator 122 by laying a pre-cut film piece of the NCP compound on the surface; the film piece has the size of first body 101, for instance the size of a semiconductor chip. The compound is a thermoset material; it may already be partially polymerized. An alternative way in semiconductor fabrication is to spin on the compound over the surface of a whole semiconductor wafer, polymerize the compound partially, and singulate the compound together with the chips from the wafer, for instance by sawing the wafer together with the compound on its surface.

When first body 101 is to be assembled on second body 102, first body 101 is brought into the proximity of second body 102 and first members 113 are aligned with the respective second members 121. When first body 101 is a bumped semiconductor chip and second body 102 a substrate with pads, the plane of the chip and the plane of the substrate are substantially parallel to each other, and each bump 113 is aligned with the respective pad 121.

After the alignment, first body 101 is moving closer to second body 102 to establish surface contact. This movement is indicated in FIG. 1 by arrows 140; the movement is substantially normal to the plane of the second body (substrate). Concurrent with the movement, first body 101 and second body 102 are vibrating with respect to each other. In FIG. 1, this vibration is indicated by the vibration arrows 150 of first body 101. Preferably, the vibration is substantially parallel to the plane of the second body (substrate) and it may include other components, for instance a vertical component in the direction of arrow 140. Alternatively, the vibration may be circular or have a circular component.

In a preferred embodiment, the vibration energy is created by a vibration motor, which is attached to the holder of first body 101. When first body 101 is a semiconductor chip, the vibration motor is coupled to the chip holder. The vibrations are transmitted from the motor through the holder to the chip and the metallic members 113. The vibration energy may involve frequencies from 50 Hz to 25 kHz (frequencies beyond 20 kHz are in the ultrasonic regime), and excursions from 0.05 to 5 µm. As the preferred energy selection, the vibration frequency ranges from 200 Hz to 500 Hz, and the vibration amplitude from 0.1 µm to 1 µm. Alternatively, the vibration frequency may be selected in the ultrasonic regime.

The mechanical vibration between the first and second body relative to each other, and thus between the first member 113 and the second member 121 relative to each other, is applied for the time period while the two metallic members 113 and 121 approach each other until tip 114 of member 113 touches tip 124 of member 121. In the course of the approach, vibrating member 113 is penetrating the NCP layer 130 and moving, while vibrating, in the direction towards member 121. While moving through the NCP layer, the vibration of member 113 is transmitted to the NCP compound.

When the member contact areas 114 and 124 of the two solid bodies 101 and 102 facing each other across the viscous compound 130 start and continue an approach to be brought into intimate contact, any residue of the compound, especially any solid particle suspended in the compound, can impede the desired contact. In the mechanical vibration of the one body (101 in FIG. 1) with respect to the other body (102 in FIG. 1) during the time period of the approach, the vibration displacements, preferably at right angle to the direction of the approach, expel all foreign particles from the diminishing separation of the bodies and enable surface contact of the two members without enclosing suspended solid particles. For some NCP compounds, the viscosity can be lowered by raising the temperature to about 170 to 190° C. and operating the assembly step at the elevated temperature.

FIG. 2 illustrates the completion of the assembly process. After surface contact between member contact areas 114 and 124 has been established, thermal energy is provided for melting the solder caps on the members and creating a uniform solder connection 210 between each member 113 and its respective member 121. The uniform solder connections 210 are substantially free of suspended filler particles and polymer residues. Consequently, the connections 210 show low and reliable electrical contact resistance, which will not degrade the stability under thermo-mechanical stress in temperature cycle applications.

The final outline of the solder 210 similar to the outline shown in FIG. 2 may result even when one of the members 113 and 121 had a solderable cap (such as gold), as mentioned above.

FIG. 2 further shows that compound 130 fills completely the space between the assembled bodies 201 and 202, fully embedding the members 113. The stand-off between body 201 and body 202 is void-free filled with compound 130. After completing the assembly, it is preferred to cross-link (polymerize) the NCP compound by curing it at temperatures between about 170 and 180° C. for a period of several hours (between 1 and 6 hours, dependent on the selected polymer formulation). By cross-linking, the NCP compound 130 hardens and its external contour 230 is stabilized into a surface, which is approximately in-line with the edge 110a of body 201 (for example, a semiconductor chip). Contour 230 may deviate slightly from a straight line by bulging somewhat due to the pressure during the assembly process described above, but contour 230 does not exhibit the meniscus typically protruding around a chip assembled on a substrate, when a precursor with conventional underfilling by capillary force is employed. It is a technical advantage that the lack of meniscus saves valuable substrate real estate.

For the assembly of semiconductor chips onto substrates, it is a technical advantage of the vibration-based method using a pre-attach NCP compound that the method lends itself to small bumps with fine pitch center-to-center. In some semiconductor products, small bumps are metallic bumps with a height between 15 and 50 µm and a pitch center-to-center of less than 150 µm. In addition, the method lends itself to mass production with short cycle time and is thus a low cost method; further, no expensive equipment, such as a vacuum suction machine, is needed. It is an additional advantage of the assembly method that the force for attaching the chip on the substrate is small and thus gentle on the mechanically weak low-k dielectrics, which are used in many semiconductor chips under the terminals 111.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the method can be extended beyond the fabrication of semiconductor devices to an assembly, where the contact areas of any two solid members immersed in a viscous compound are to be joined so that the final contact of the areas is not impeded by a residue of the compound, especially not by any solid particle suspended in the compound. Examples of bumped members can be found in Micro-Electro-Mechanical devices (MEMS), medical and photographic devices, and automotive controls. Lasting during the time period it takes the members for approaching each other, one of the members vibrates with respect to the other member so that the vibration displacements are preferably at right angles to the direction of the approach. The motion expels compound along with any solid particle from the approaching areas until the surfaces achieve intimate contact.

It is therefore intended that the appended claims encompass any such modifications or embodiments.

I claim:

1. A method for attaching a semiconductor chip to a substrate, comprising the step of:
   providing a first contacting area of a first member affixed to the chip and a second contacting area of a second member affixed to the substrate;
   immersing the first and second members in a polymeric compound; and
   applying mechanical vibration to the compound while the contacting areas of the first and the second member approach each other.

2. The method of claim 1 wherein the mechanical vibration causes displacements of the first member relative to the second member.

3. The method of claim 2 wherein the vibration includes displacements oriented at right angles to the direction of the approach.

4. The method of claim 3 wherein the vibrations include ultrasonic frequencies.

5. The method of claim 1 wherein the polymeric compound includes a non-conductive adhesive resin and filler particles.

6. The method of claim 5 wherein the metallic members include a non-reflowable metal.

7. The method of claim 6 wherein at least one member includes a cap of reflowable metal at the contacting area of the member.

8. The method of claim 7 further including, after the step of applying, the step of raising the temperature of the device above the melting temperature of the at least one reflow metal cap so that the caps of the two members can unite and the two members are assembled.

9. The method of claim 8 wherein the height of the assembled members is in the range from about 15 to 50 μm.

10. The method of claim 9 wherein at least one of the members has an elongated shape.

11. The method of claim 10 wherein the elongated member is attached to a semiconductor chip.

12. The method of claim 9 wherein at least one of the members has a pad-like shape.

13. The method of claim 12 wherein the pad-like member is attached to a substrate.

14. The method of claim 1 further including additional members adjacent to the first member, wherein the pitch center-to-center of the additional members and the first member is less than 150 μm.

15. The method of claim 1 further including additional members adjacent to the second member, wherein the pitch center-to-center of the additional members and the second member is less than 150 μm.

* * * * *